… …

United States Patent [19]

Love

[11] Patent Number: 5,477,160

[45] Date of Patent: * Dec. 19, 1995

[54] MODULE TEST CARD

[75] Inventor: David G. Love, Pleasanton, Calif.

[73] Assignee: Fujitsu Limited, Japan

[*] Notice: The portion of the term of this patent subsequent to Nov. 8, 2011, has been disclaimed.

[21] Appl. No.: 103,294

[22] Filed: Aug. 6, 1993

Related U.S. Application Data

[63] Continuation-in-part of Ser. No. 929,000, Aug. 12, 1992, Pat. No. 5,363,038.

[51] Int. Cl.⁶ .................................................. G01R 1/04
[52] U.S. Cl. ............................................ 324/755; 439/66
[58] Field of Search ..................... 439/66; 324/158 R, 324/158 F, 158, 754, 755, 756, 757

[56] References Cited

U.S. PATENT DOCUMENTS

| | | |
|---|---|---|
| 3,634,807 | 2/1972 | Grobe ............................................ 339/17 |
| 3,746,973 | 7/1973 | McMahon, Jr. .............................. 324/51 |
| 4,760,335 | 7/1988 | Lindberg ................................. 324/158 F |
| 4,937,203 | 6/1990 | Eichelberger et al. ...................... 437/81 |
| 5,007,163 | 4/1991 | Pope et al. .................................. 29/840 |
| 5,053,698 | 10/1991 | Ueda .......................................... 324/158 |

*Primary Examiner*—Kenneth A. Wieder
*Assistant Examiner*—Barry C. Bowser
*Attorney, Agent, or Firm*—Christie, Parker & Hale

[57] ABSTRACT

Manufacturing of semiconductor devices is facilitated when the device chip carriers of the devices are tested, prior to population of chips thereon, by a module test card. The module test card is formed by a test substrate and a plurality of test chips mounted on the test substrate. Connections are provided on the test substrate for connecting to a tester. Through the module test card, the device chip carriers are tested under simulation of their operating conditions.

23 Claims, 11 Drawing Sheets

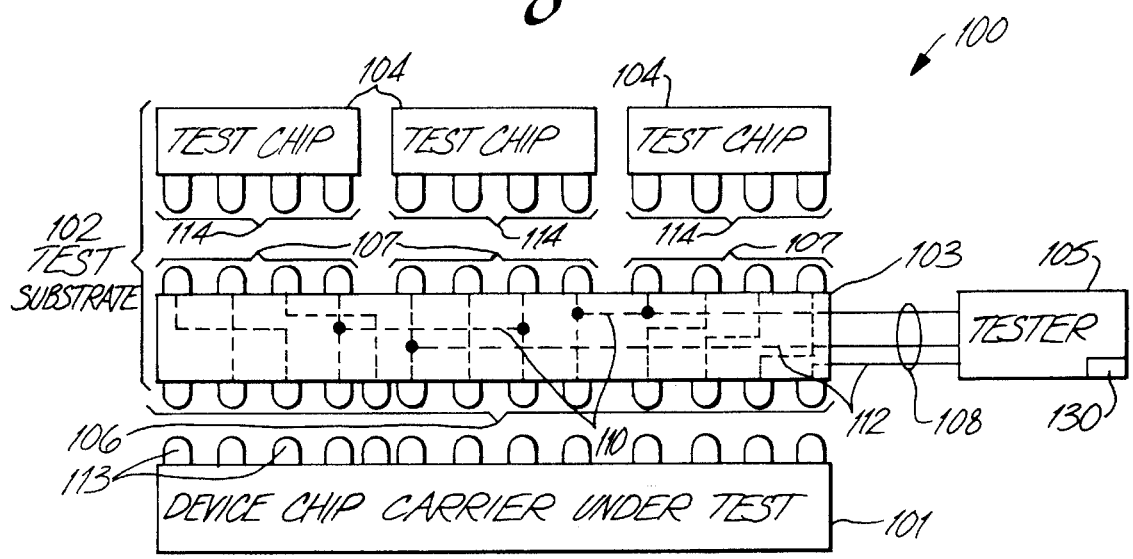
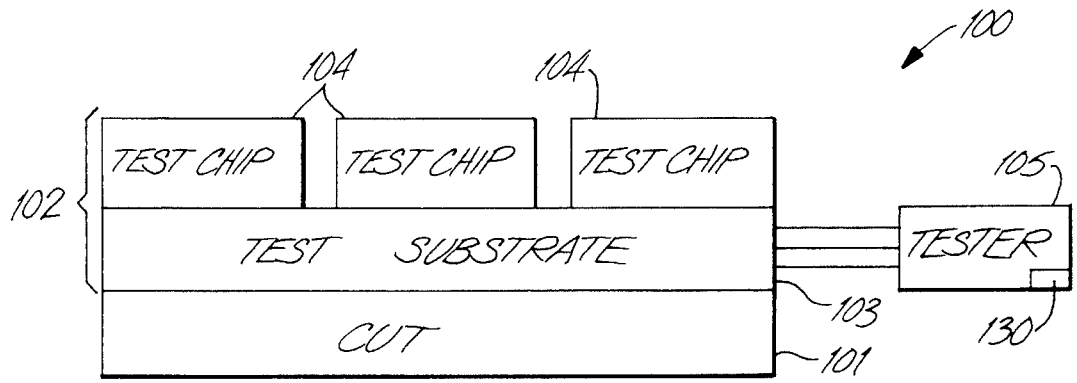

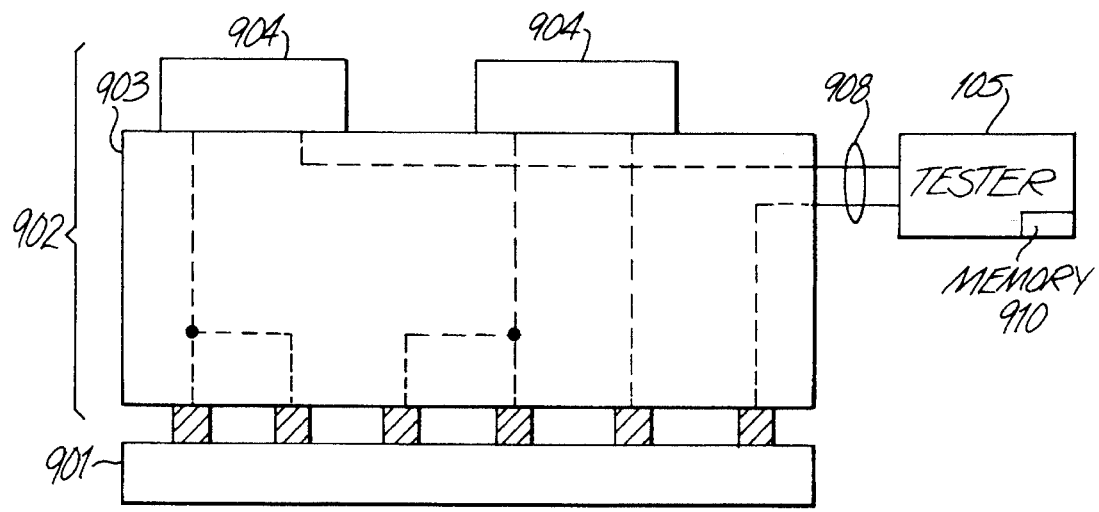
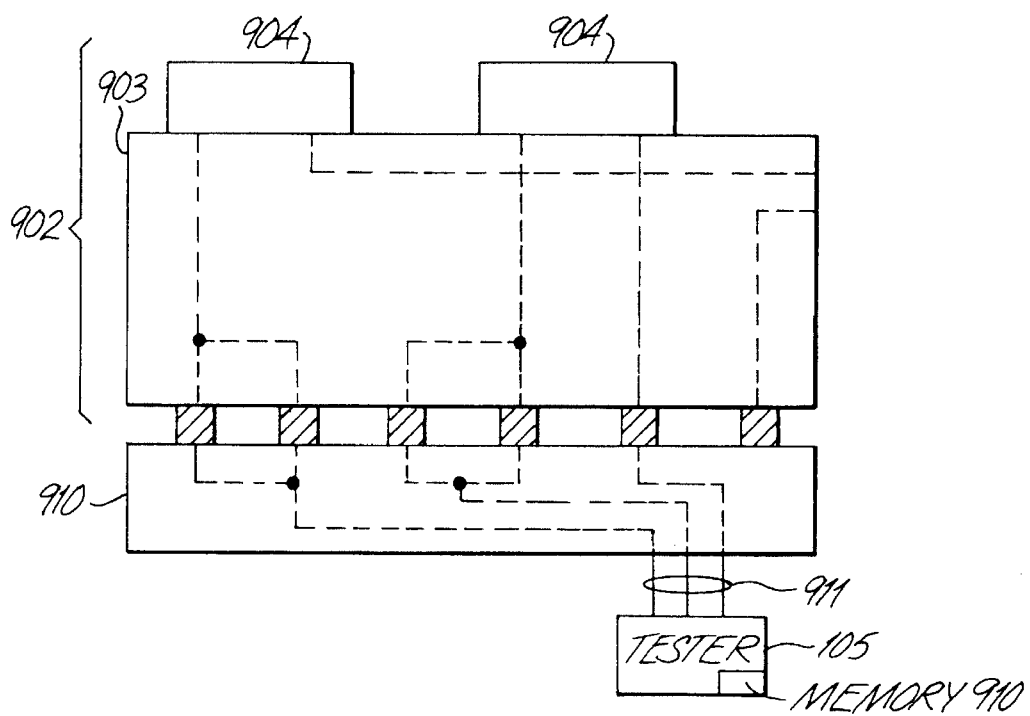

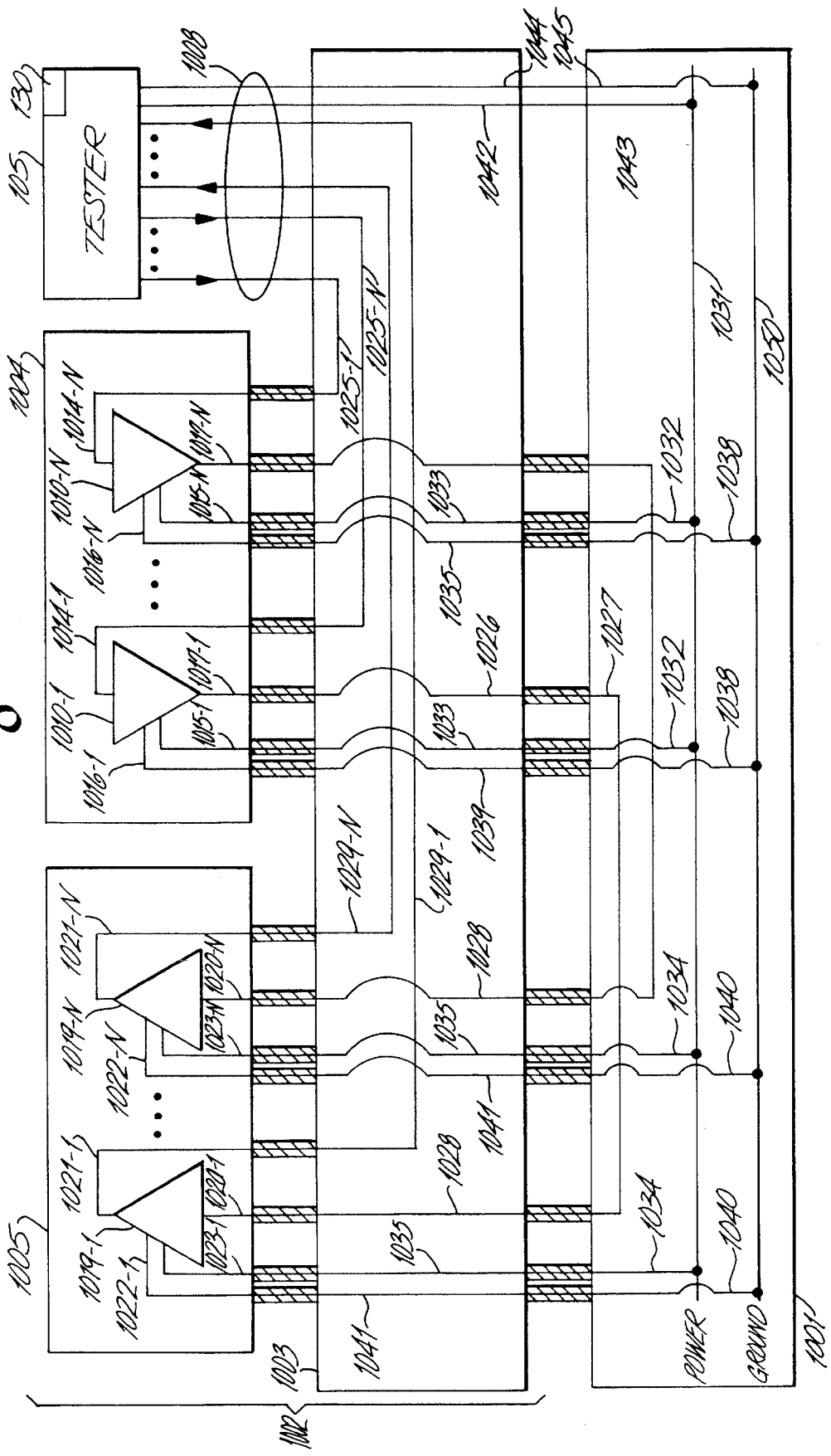

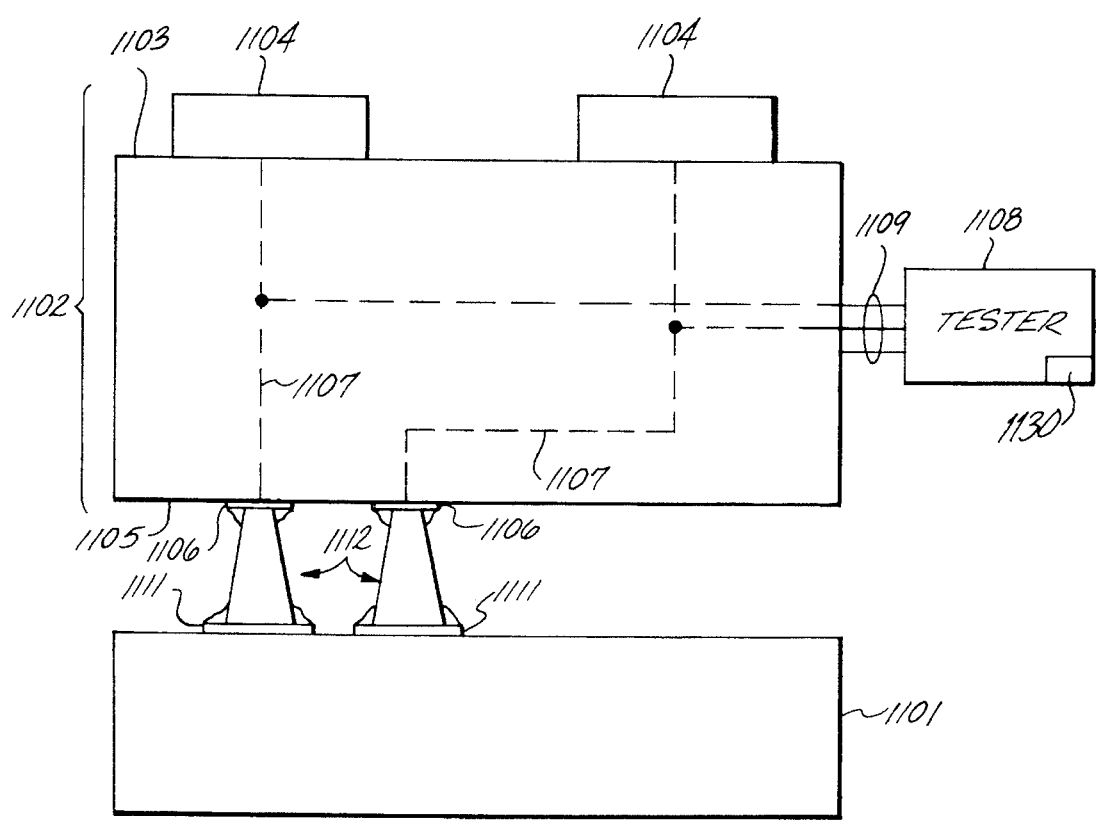

MODULE TEST CARD

CROSS REFERENCE TO RELATED APPLICATION

This is a continuation-in-part of patent application Ser. No. 07/929,000, filed Aug. 12, 1992, now U.S. Pat. No. 5,363,038 the disclosure of which is incorporated herein by this reference. This application also discloses subject matter common with patent application Ser. No 07/977,571 filed Nov. 17, 1992, now U.S. Pat. No. 5,334,804, the disclosure of which is incorporated herein by this reference.

TECHNICAL FIELD

This invention relates in general to semiconductor device packaging and in particular to carriers of semiconductor chips. More specifically, this invention relates to a technique and apparatus for increasing yield in the manufacturing of semiconductor devices by testing the carriers prior to population of semiconductor chips thereon.

BACKGROUND OF THE INVENTION

The increasing complexity of electronic systems has led not only to the use of semiconductor chips with increasing scales of integration, but also of chip carriers with smaller bond pad geometries, closer bond pad pitches, and higher net (interconnections) counts. Furthermore, as electronic circuits become faster and signal timings become more crucial, lower tolerances are now affordable for deviations in electrical properties, such as resistance, inductance, and capacitance, of carriers. As a result, it has become increasingly more difficult to attain high yield in the production of both chips and chip carriers. Compounding the problem is the growing cost of rework that is caused by the increasing scale of integration and the common use of multi-chip carriers.

For the above stated reasons, it has become economically important in the manufacturing of semiconductor devices not only to test the chips, but also the chip carriers prior to assembling them together to form a device.

However, as semiconductor devices operate faster and propagation speed of signals through the carriers becomes more crucial, prior art instruments that merely test for continuity and/or capacitance of signal paths are no longer deemed satisfactory.

Digital transmission lines in the carriers have traditionally been electrically tested by measuring continuity, capacitance, inductance, and impedance. In addition, discontinuities in the transmission line have been tested using time domain reflectometry. Each of these tests is a functional test in which the signal paths of the circuit under test are tested by providing signals to the transmission lines and analyzing the resulting signals from the transmission line. In particular, the signal at the opposite end of the transmission line is verified so that the transmitted signal is readable by an input of an integrated circuit (IC). For digital signals, this requires that the edges of (and correspondingly the rise and fall times) and the amplitude of a signal pulse do not degrade while propagating through the carrier, so that when the transmitted signal pulse is provided to the IC, the IC recognizes the pulse as a proper signal and responds accordingly. Thus, a simple functional test is desired to replace these highly complex electrical tests.

In addition to the difficulties of testing the inductance, capacitance, resistance, and impedance of the signal paths at high frequencies, such as 10 GHz, this testing provides only a partial determination of whether the functional substrate operates as desired.

It is an object of the invention to run a simple test such as a computer program that generates simultaneous switching and transmission of signals along parallel paths to detect such failures as ground bounces and cross talk on a bad carrier.

It is an object of the invention to provide a test of the substrate that adequately simulates the operational environment of the carrier to properly determine whether the carrier sufficiently degrades the electrical signals as they pass through the carrier so that the degraded electrical signals do not activate the input portion of the next integrated circuit in the circuit chain. It is a further object of the invention to provide a test method that eliminates the need for determining the electrical parameters described above and which greatly simplifies the test equipment.

What is needed for increasing the yield of manufacturing semiconductor devices is a test technique and apparatus that can simulate the operating environment of the carriers.

SUMMARY OF THE INVENTION

In one aspect, this invention relates to a method for manufacturing semiconductor devices each formed by a plurality of integrated circuit chips and a carrier of the chips. The method comprises the step of coupling the chip carrier, prior to population of chips thereon, to a module test card. The module test card comprises a test substrate populated with test chips. The method further comprises the steps of coupling the module test card to a tester, applying a set of test signals to the module test card, monitoring for a set of resultant signals in a simple data stream (of logic 1's and 0's) resulting from these test signals and rejecting the carrier if the resultant signals reveal that the carrier is defective.

In another aspect, this invention relates to an apparatus for testing a device chip carrier prior to population of chips thereon to form a semiconductor device. The apparatus comprises a test substrate, a plurality of test chips coupled to the test substrate and a plurality of connectors for coupling the test substrate to a tester.

By testing the carriers and rejecting the defective ones prior to populating chips thereon, rework due to a defective carrier is avoided and yield of the manufacturing process is improved.

BRIEF DESCRIPTION OF THE DRAWINGS

FIGS. 1a–1b illustrate one embodiment of the present invention.

FIG. 9a is a schematic view of a carrier test system using memory chips on a module test card to store test results therein during testing according to principles of this invention.

FIG. 9b is a schematic view of a carrier test system using a memory read-back probe head to read the test results stored in the memory on a module test card according to principles of this invention.

FIG. 10 is a schematic view of a carrier test system illustrating the use of driver and receiver circuitry for testing the simultaneous switching characteristics of a carrier under test according to principles of this invention.

FIG. 11 is a schematic view of a carrier test system using wire interconnect structures for coupling a module test card to a carrier under test according to principles of this invention.

DESCRIPTION OF SPECIFIC EMBODIMENTS

Figure 2A:
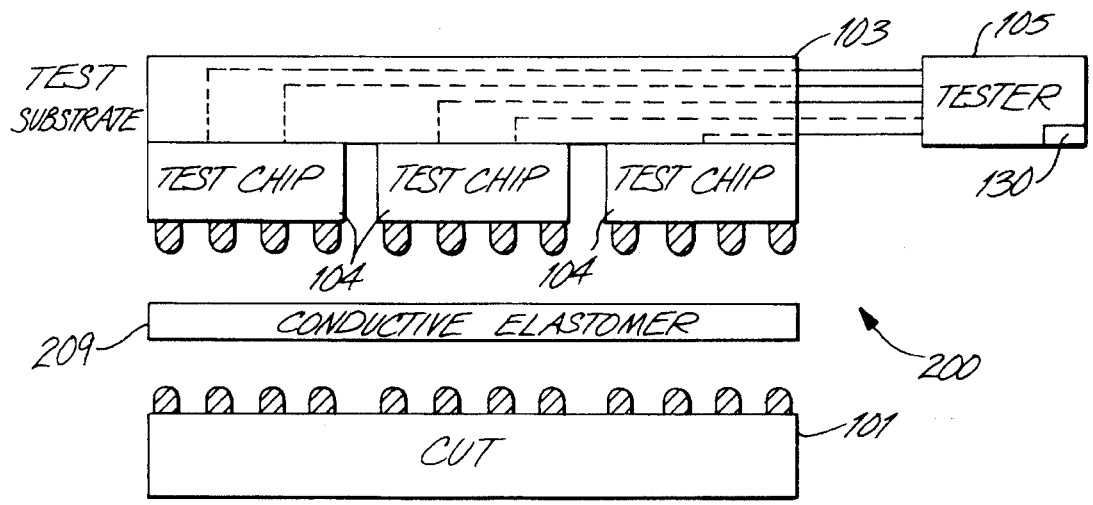
FIGS. 2a–2b illustrate another embodiment of the present invention.

When manufacturing multi-chip modules (MCM) a functional carrier may be employed having resistors, capacitors and/or electrical interconnections built into or onto a substrate. Each interconnection has an acceptable range for its own resistance, inductance and internal capacitance. A number of integrated circuit chips may be mounted on such a carrier. It is desirable to thoroughly test such carriers before any chips are mounted, however, current testing techniques do not adequately emulate the operating environment of the carriers, at high frequencies, such as 1 GHz and above.

This invention provides a technique for, in effect, temporarily mounting IC chips on a carrier for exercising the carrier in effectively the same manner the carrier is to be used in its final environment. Since many chips are involved on a carrier, a module test card is employed. A number of IC chips are mounted on a module test card (MTC) which also includes means for connecting the MTC to a tester or analyzer which provides driving signals emulating those, or a subset of those, to which the MCM will see in its operating environment and also collects output signals from the MTC to verify that a carrier under test operates as desired or fails the tests.

The MTC not only supports the test chips, it provides a means for connection between the test chips and the carrier under test. In one embodiment, the MTC has a pattern of electrical connections on its surface corresponding to the pattern of electrical connections between the carrier and the chips that will finally be mounted on the carrier. Alternatively, several test chips may be mounted on the same side of the MTC as the carrier under test and electrical connections are made directly between the chips and the carrier. In this arrangement, additional electrical connections are made between the test chips and the MTC substrate for introducing test signals and transmitting signals from the carrier to the tester for analysis.

FIG. 1a is a cross-sectional schematic diagram of a carrier test system using a module test card according to principles of the invention. FIG. 1b is a side plan view illustrating the carrier test system of FIG. 1a. A carrier test system 100 comprises a chip carrier under test (CUT) 101, a module test card 102, a tester 105, and connectors 108. In a typical manufacturing process wherein the present invention is utilized, the chip carrier 101 is tested prior to committing regular chips thereon, so that the chip carrier 101 can be rejected if found defective and thereby eliminating the need for reworking a populated carrier. It should be noted, however, that the present invention can similarly be used to test a carrier during a rework operation. It should also be noted that, rather than testing the whole chip carrier, the present invention may be applied to test only a portion thereof (for example, the portion which holds a newly-designed circuit, or the portions that carry a critical signal path).

Referring back to FIG. 1a, a thin film test substrate 103 and a plurality of test chips 104 form the module test card (MTC) 102 which can be used to successively test different chip carriers.

Testing is performed by connecting the carrier under test 101 to the module test card 102, which in turn is connected to the tester 105. The tester 105 has a memory 130 for storing the test program, the expected test results, and the measured test results. The tester 105 applies test signals to the module test card 102 and monitors for expected signals resulting therefrom.

The test substrate 103 may be formed by using conventional techniques such as a printed circuit board made of dielectric material such as ceramic or glass. A teaching of such techniques can be found in *Electronic Packaging and Interconnection Handbook* by C. A. Harper, 1991, published by McGraw-Hill.

When needed by specific applications, the test substrate 103 may be a multi-layer structure comprising several signal planes and power planes. In a manner well known in the art, interconnections may be formed on a surface metallization layer or within the signal planes, or both. Depending upon specific needs (i.e., depending upon the tests to be performed on the carrier under test 101, which in turn are dependent upon the construction of the carrier under test 101 and its operational end use), these interconnections may include signal paths 109 for interconnecting the test chips 104 and the carrier under test 101, signal paths 110 for interconnecting specific points among the test chips 104, signal paths 111 for interconnecting the test chips 104 and the tester 105, and signal paths 112 for interconnecting the carrier under test 101 and the tester 105. Vertical interconnections such as signal paths 109 can be formed by means of through-holes using such techniques as drilling, reactive ion etching or plasma etching, which are well known in the art.

The test substrate 103 has a first set of connectors or bond pads 106 on its bottom surface for bonding and providing electrical contact and connection to the carrier under test 101. The pattern of this first set of bond pads 106 typically matches the pattern of bond pads 113 on the carrier under test. Preferably, materials are used such that connections between the carrier under test and the test substrate can be decoupled easily. Material for the set of bond pads 113 is preferably chosen so that the set of bond pads is reusable and thus the module test card 102 can be used for testing more than one carrier under test.

A second set of bond pads 107 is provided on the top surface of the test chip substrate 104 for coupling to a set of bond pads 114 on the bottom surface of the test chips 104.

A third set of bond pads 108 is provided on the test substrate 103 for connecting to a tester 105. Without limiting the generality hereof, this set of bond pads 108 may have a geometry and contacts for connecting to a standard tester.

The test chips 104 can be coupled to the test substrate 103 by conventional means such as epoxy bonding, thermoplastic bonding or eutectic die bonding. The test chips 104 can also be bonded to the test substrate 103 using a conventional tape automated bonding (TAB) or wire bond process. For use with a TAB or wire bond process, the test substrate 103 would be provided with die attach and outer lead bond sites (see Harper, supra).

The test chips 104 operate to simulate the end use circuits in the end use chip(s) that will be attached to the carrier under test 101 in the end use product. If the module test card 102 is used for testing a particular portion of the carrier under test 101, the test chips 104 are implemented to simulate the end use chips of that portion.

The test chips 104 may be implemented such that they simulate the exact functions of the end use chips of the carrier under test 101, or only a subset of these functions.

As will be illustrated hereinafter, the test chips 104 may also be implemented such that they perform functions different from those performed by the end use chips of the carrier under test 101. For example, one test chip may simply operate to pass a signal sent by the tester into one point of a critical path, while another test chip 104 operates to pass the signal output from an other point of the critical path back to the tester. The tester 105 may simply measure the difference between the time when it sends the signal and the time the return signal is received. From such measurement, the length of the signal path may be calculated or demonstrated to be within a specified range.

The test chips 104 may contain a plurality of gate array elements implemented into specific logic functions. As discussed above, these test functions are dependent upon the tests to be performed, which in turn are dependent upon the construction of the carrier under test or the final device, or both. As with a conventional gate array, the implementation is achieved by adhering a top metal layer of pathways between the gate array elements into a specific pattern.

FIG. 1*b* shows the test setup 100 with the test substrate 103 having the test chips 104 bonded thereon and the carrier under test 101 coupled thereto.

Figure 7:
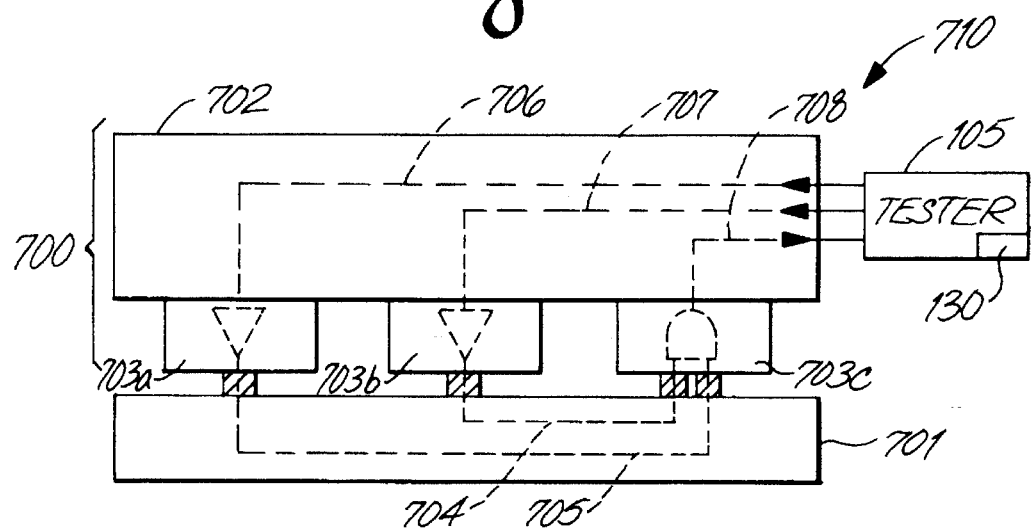
FIG. 7 illustrates yet another exemplary test setup which embodies the present invention.

FIG. 7 is a schematic diagram of a carrier test system illustrating the use of driver and receiver circuitry for testing the signal-to-noise ratio of signal paths in a carrier under test in one implementation of the invention. In this implementation, the carrier test system 710 comprises a carrier under test 701 having two signal paths 704, 705. To test whether the signal-to-noise ratios of the signal paths in the carrier under test 701 are within an expected value, the carrier test system also comprises a tester 105 and a module test card 700. The module test card 700 comprises a test substrate 702 and a plurality of test chips 703*a*, 703*b*, and 703*c*. A driver is fabricated in each of the test chips 703*a* and 703*b*. A logic gate is fabricated in the test chip 703*c*.

To test whether the signal-to-noise ratio of the paths of a carrier under test 701 are within the expected value, electric test pulses are driven from the tester 105 into signal paths 706 and 707 in the module test card. From the test card paths 706 and 707, the test pulses enter the respective drivers. In response to the test pulses, the drivers 703*a* and 703*b* provide test signals through the paths 704, 705, respectively to separate inputs of the logic gate in the test chip 703*c*. The output signal from the logic gate in the test chip 703*c* is received by the tester 105.

If the signal-to-noise ratio of the paths 704, 705 in the carrier under test 701 is within an expected value, the test chip 703*c* provides a first predetermined signal pulse to the tester 105. However, if the signal-to-noise ratio of any one of the paths 704, 705 fails, the test chip 703*c* provides a second predetermined signal to the tester 105. By varying the edges and the timing of the test pulses, an estimate of the signal-to-noise ratio of the paths 704 and 705 in the carrier under test 701 can be obtained.

FIG. 10 is a schematic view of a carrier test system illustrating the use of driver and receiver circuitry for testing the simultaneous switching characteristics of a carrier under test according to principles of this invention.

In this implementation, a carrier under test (CUT) 1001 is tested using a module test card 1002 which comprises a test substrate 1003, a plurality of driver test chips 1004, and a plurality of receiver test chips 1005 (one driver test chip 1004 and one receiver test chip 1005 are shown for simplicity and clarity). The test chips 1004, 1005 are coupled by a plurality of connectors to the top surface of the test substrate 1003.

The module test card 1002 is temporarily bonded to the carrier under test 1001 by coupling a plurality of bond pads on the bottom surface of the module test card 1002 to corresponding bond pads on the carrier under test 1001 by a plurality of connectors, in a manner similar to that described above in conjunction with FIG. 1. The tester 105 is coupled to the test substrate 1003 by a bond pad 1008 which comprises a plurality of electrical connections from the tester to a corresponding plurality of bond pads on the test substrate 1003.

The driver test chip 1004 has a plurality of drivers 1010-1 through 1010-N. Each driver 1010-1 through 1010-N has a respective input line 1014-1 through 1014-N, a power line 1015-1 through 1015-N, a ground line 1016-1 through 1016-N, and an output line 1017-1 through 1017-N. Each line 1014, 1015, 1016, 1017 connects the driver to a corresponding bond pad on the bottom surface of the driver test chip 1004.

The receiver test chip 1005 has N receivers 1019-1 through 1019-N with a respective input line 1020-1 through 1020-N, an output line 1021-1 through 1021-N, a ground line 1022-1 through 1022-N, and a power line 1023-1 through 1023-N. Each line 1020, 1021, 1022, 1023 connects the receiver 1019 to a corresponding bond pad on the bottom surface of the receiver test chip 1005.

The tester 105 provides test signals to a plurality of lines 1025-1 through 1025-N which are communicated through bond pads to the input line 1014-1 through 1014-N and provided to the corresponding driver 1010. The driver 1010 provides on the line 1017 a switching signal through a bond pads to a line 1026 which extends from the top surface of the test substrate 1003 to a corresponding bond pad on the bottom surface of the substrate. The lines 1026 are shown as extending vertically from the top surface to the bottom surface of the test substrate for simplicity and clarity. However, the invention is not limited to vertical interconnection. The lines 1026 translate electrical signals from the driver test chips 1004 to a pattern of bond pads corresponding to respective bond pads on the top surface of the carrier under test 1001. The signals are then provided through a bond pad to a line 1027 in the carrier under test 1001 which electrically translates the signal from one bond pad to another bond pad and through a line 1028 in the test substrate 1003 which in turn is provided through a bond pad to the input line 1020 of the receiver 1019. In response to the translated electrical test signal, the receiver 1019 provides a switching signal on the output line 1021 through a bond pad and a line 1029 in the test substrate 1003, which communicates the switching signal to the tester 105 through the connector 108.

The tester 105 provides power through the connector 1008 to a power line 1042 in the test substrate 1003 and through a bond pad and a line 1043 in the carrier under test 1001 to a power line 1031 in the carrier under test. Power to the driver 1010 is provided from the power line 1031 through a power line 1032 in the carrier under test 1001 and a corresponding power line 1033 in the test substrate 1003 through a bond pad to the power line 1015 in the driver 1004. Similarly, power to the receiver test chip 1005 is supplied from the power line 1031 along a power line 1034 in the carrier under test 1001 and a power line 1035 in the test substrate 1003 to the power line 1023 in the receiver chip 1019.

In an analogous manner, the tester 105 provides a ground for the drivers 1010 through the connector 1008 to a ground line 1044 in the test substrate 1003 and through a bond pad to a ground line 1045 in the carrier under test 1001 to a ground line 1050 in the carrier under test. The ground line 1050 provides a ground for the drivers 1010 through a ground line 1038 in the carrier under test 1001 and a ground line 1039 in the test substrate 1003. The receivers 1019 are grounded to a ground line 1040 in the carrier under test 1001 through the ground line 1022 in the receiver test chip 1005 to the ground line 1041 in the test substrate 1003.

In many processor applications, a plurality of signals switch simultaneously because of a multi-bit bus configuration of the processor. Ground bounce occurs on signal lines due to power and ground depletion caused by simultaneously switching a large number of switching drivers and receivers on other signal lines. The test circuit simulates this ground bounce in the carrier under test 1001 by the tester 105 providing a series of simultaneous switching signals to the driver 1010 which are communicated through the test substrate 1003 to the carrier under test 1001. As the signals propagate through the carrier under test 1001, the voltage and current on the signal lines simultaneously switch, thereby causing the ground bounce described above. By measuring the output signals from the receiver chips 1019, the tester 105 determines whether the carrier under test 1001 degrades the test signals during communication therein.

Figure 8:
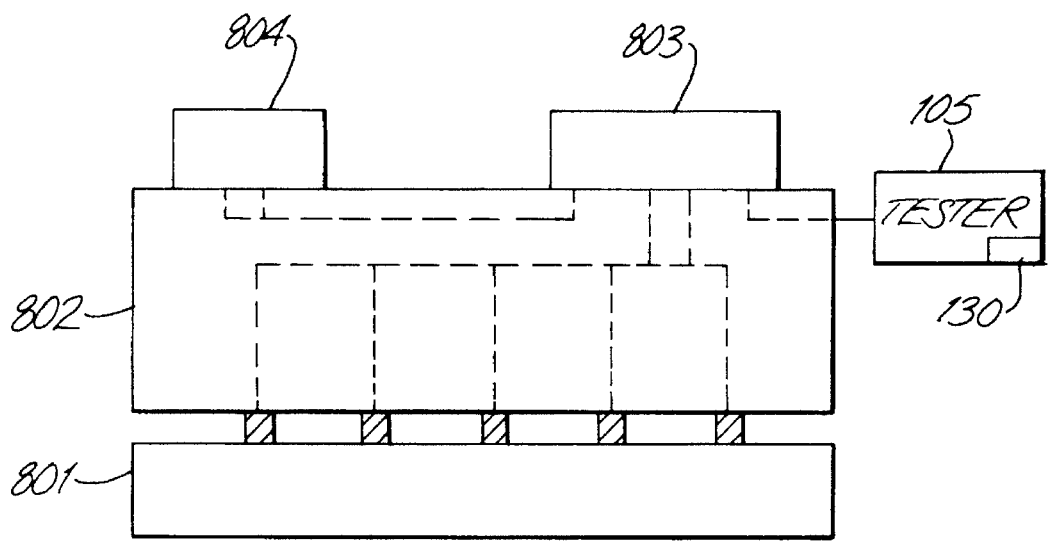
FIG. 8 illustrates yet another exemplary test setup which embodies the present invention.

FIG. 8 is a schematic view illustrating yet another implementation of the present invention in which the test chips execute a test program and temporarily store the test results therein. In this implementation, the test chips comprise a plurality of processors 803 and a plurality of memories 804. (Only one processor and one memory are shown in FIG. 8 for simplicity and clarity.) The test substrate 802 is coupled to the carrier under test (CUT) 801 as described above. After initiation by the tester 105, the processor 803 operates to execute a program stored in the memory 804. The instructions and data of the program are retrieved by the processor 803 from the memory 804 through signal lines internal to the test substrate 802.

Through execution of the program, the processor 803 injects signals into a circuit under test (CUT) 801 via the test substrate 802. Certain signals (such as digital signals with logic 1's and 0's) are then received by the processor 803 and stored in the memory 804. When execution of the program is completed (or while the program is being executed), the processor 803 retrieves certain data from the memory 804 and forwards the data to the tester 105. By comparing these data with expected data, the tester 105 determines whether the carrier under test 801 is defective or not.

Alternatively, the chips 803, 804 may each contain both a memory and a processor. In this implementation, each processor executes in parallel a software program and stores the test results in a corresponding memory in the test chip.

FIG. 9a is a schematic view of a carrier test system using memory chips on a module test card to store test results therein during testing according to principles of this invention. FIG. 9b is a schematic view of a carrier test system using a memory read-back probe head to read the test results stored in the memory on a module test card according to principles of this invention.

As described above in FIG. 8, the test chips comprise both a processor 803 and a memory 804 for storing test data therein. In addition, the embodiment of FIG. 8 shows the processor 803 reading the contents of the memory 804 and providing the data to the tester 105 while the module test card is connected to the test substrate and while the test is being conducted or after it is completed. This implementation has the limitation that the substrate must have sufficient signal traces interconnecting the processor and the tester for communicating the test data from the test chips to the tester.

Referring now to FIGS. 9a and 9b, in contrast to the embodiment of FIG. 8, this embodiment stores the test results and probes the memory chips after the module test card is decoupled from a carrier under test (CUT) 901.

Referring now to FIG. 9a, similar to the module test card described above, a module test card 902 comprises a test substrate 903 and a plurality of memory chips 904 coupled to the top surface of the test substrate. The bottom surface of the test substrate 904 has a plurality of bond pads connected to signal lines within the substrate. The tester 105 and the memory chips 904 also are connected to the signal lines. The tester 105 is coupled by a connector 908 to the module test card 902.

The module test card 902 is temporarily bonded to the carrier under test 901 by coupling the plurality of bond pads on the module test card to corresponding bond pads on the carrier under test 901 in the manner described above in conjunction with FIG. 1. During testing, the tester 105 provides test signals through the connector 908 and the module test card 902 to the carrier under test 901 in a manner similar to that described above. In addition, the tester 105 provides addressing and control signals through the connector 908 and the module test card 902 to the memory chips 904. As the tests are being performed, the test signals propagate through the module test card 902 and into the carrier under test 901. After propagating through the carrier under test 901, the test signals are communicated back through the module test card 902 to the memory chips 904. Concurrent with the propagation of the test signals, the addressing and control signals are communicated through the module test card 902 and applied to the memory chips 904. Using the control signals, the tester 105 enables the memory chips 904 and sets them into a write mode in which data can be stored in the chips. As tests are performed, the tester 105 addresses different portions of the memory chips 904 to store the test results therein.

Referring now to FIG. 9b, a memory read-back probe head 910 (hereinafter "probe head") has a plurality of bond pads arranged in a pattern matching a subset of the plurality of bond pads on the module test card 902. Because the test results are stored in the memory chips 904, the test probe 910 need only have sufficient bond pads for reading the contents of the memory. Thus, after testing, the carrier under test 901 is removed from contact with the module test card 902. The probe head 910 is then attached to the module test card 902 in a manner similar to that described above for connecting the module test card 902 to the carrier under test 901. The tester 105 generates the appropriate signals for evaluating the test data and debugging the carrier under test 901 and provides the signals through a connector 911 and through the probe head 910 to the corresponding bond pads thereon. The signals are then communicated to the module test card 902 to command the memory chips 904 to download their contents through the probe head 910 to the tester 105. The tester 105 then compares the read test data to expected data stored in a memory 910 of the tester. If there is a discrepancy between the memory data and the expected data, a failure has been detected in the carrier under test 901 and the type of failure is displayed on the tester 105 for a decision by the user for the repair or discard of the defective carrier under test 901.

Figure 2B:
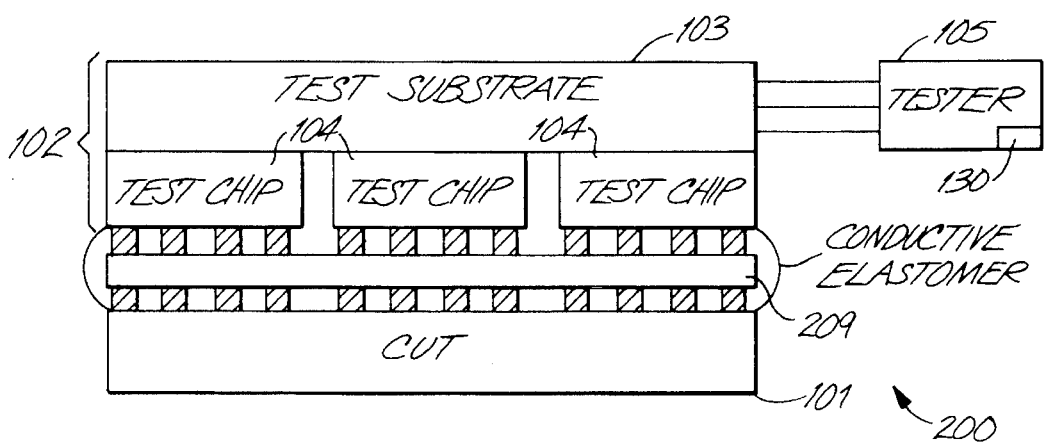

FIGS. 2a and 2b are cross-sectional schematic diagrams illustrating another implementation of the present invention. In this implementation, the module test system 200 comprises a test substrate 103, a plurality of test chips 104, and a carrier under test (CUT) 101. However, instead of having the carrier under test 101 itself coupled to the test substrate 103, the carrier under test 101 is coupled to the test chips 104 which in turn are bonded to the test substrate 103. The connections between the carrier under test 101 and the test chips 104 is shown in FIGS. 2a and 2b to be made through an electrically conductive adhesive, such as a z-axis elastomer 209. However, as disclosed above, other kinds of connections can also be used including direct contact. It is preferable, however, that materials be used such that connections between the carrier under test and the module test card can be decoupled easily. It is also preferable that the materials used for coupling to a carrier under test be reusable.

Figure 3A:
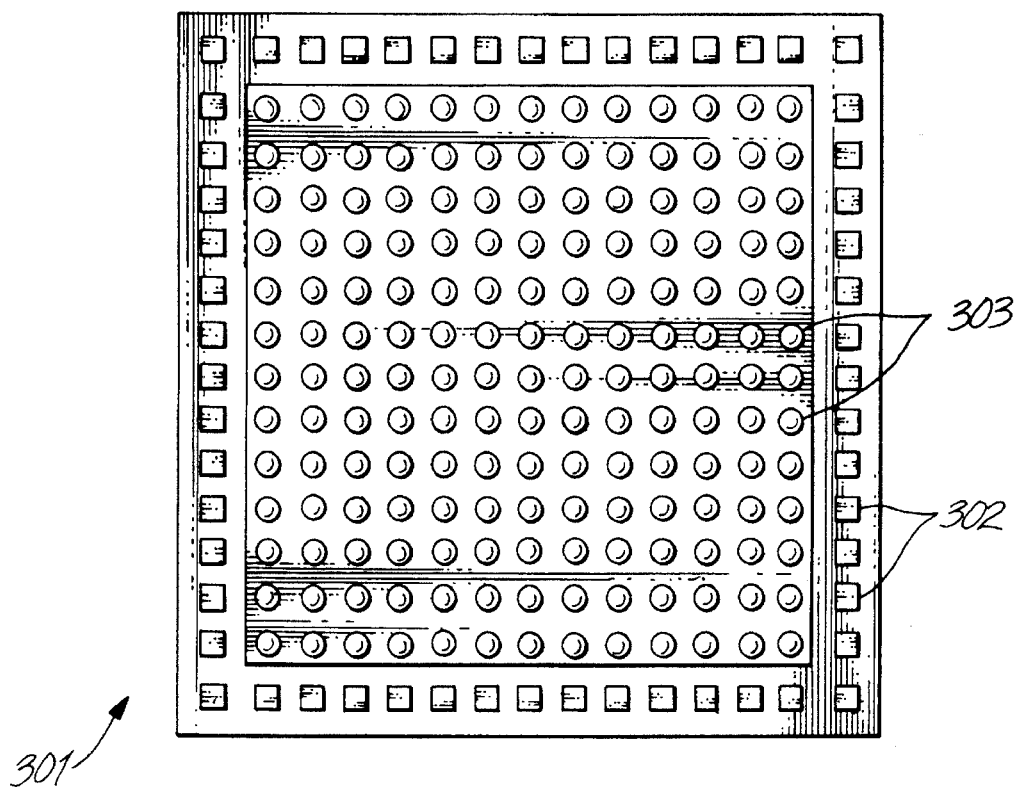
FIG. 3a illustrates an external design of a test chip for use in the implementation of FIGS. 2a–2b.

FIG. 3a illustrates schematically an external design of a test chip 301 for use in the setup 200 of FIG. 2. According to this design, the test chip 301 has a plurality of peripheral bond pads 302 for connecting to the test substrate through conventional tape automated bonding (TAB). The test chip 301 also has a plurality of bumps 303, formed of such material as gold, solder or conductive elastomer, for connecting to the carrier under test 101. These bumps 303 typically match the bond sites on the carrier under test 101.

Figure 3B:
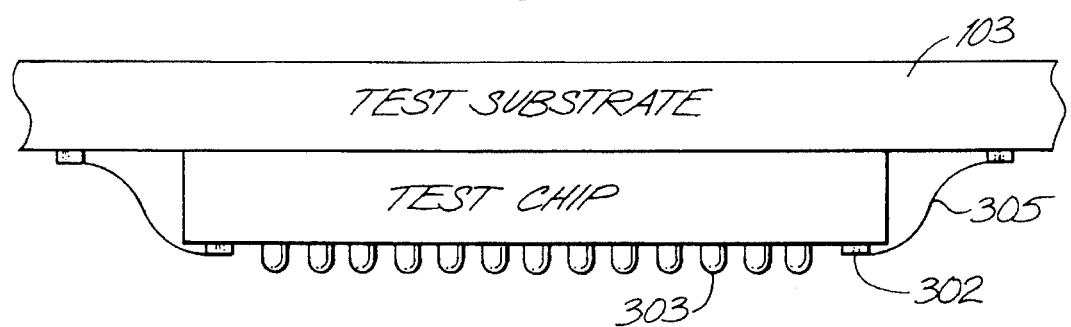
FIG. 3b is a schematic diagram illustrating how the test chip of FIG. 3a is coupled to a test substrate.

FIG. 3b is a diagram illustrating how the test chip 301 of FIG. 3a is bonded to the test substrate 103. As shown, the peripheral bond pads 302 of the test chip 301 are attached to the inner lead bond of the TAB tape 305. The bumps 303 are taller than the total thickness of the TAB tape 305 and the TAB bond pads 302.

Having described the module test card, the interconnections are now described. The carrier test system 100 and the test method for using it accommodate several flip chip methods of interconnection such as solder bumps, gold bumps for flip tab or direct connection such as microbump technology used by Matsushita.

In addition, the method for interconnecting the module test card to the carrier under test may also use a wire interconnect technology (WIT).

As an overview, the WIT interconnect comprises a wire pin attached to an bond pad on a first device and a solder bump attached to an bond pad on a second device, the second device being spaced apart from and opposite to the first device. The wire pin may be on the test chip 104 or the test substrate 103. Summarily, the wire pin may be on the bottom surface of the test substrate 103 or on the carrier under test 101 where the substrate carries the solder bump. An opposing compliant bump may also be used on the module test card for interconnection during test. The compliant bump may be made of solder or a conductive elastomer. In addition, an interposer such as a conductive elastomer sheet can be inserted between the bumps to insure compliant connection between the corresponding bumps.

Figure 12:
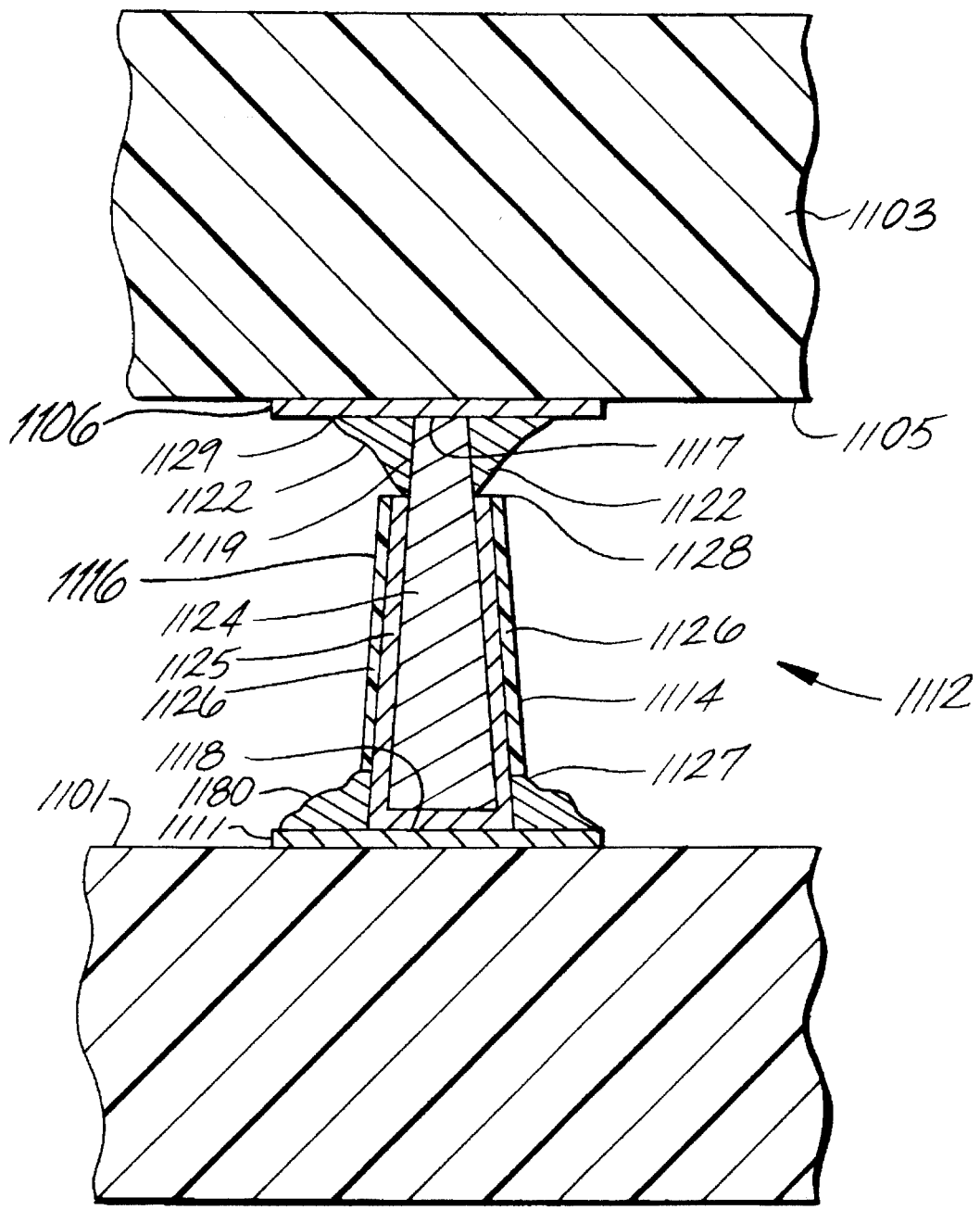
FIG. 12 is a cross-sectional view of the wire interconnect structure of FIG. 11 showing the contact of the module test card to the carrier under test.

FIG. 11 is a schematic view of a carrier test system using wire interconnect structures for coupling a module test card to a carrier under test according to principles of this invention. FIG. 12 is a cross-sectional view of the wire interconnect structure of FIG. 11 showing the contact of the module test card to the carrier under test.

Similar to the module test card described above, a module test card 1102 comprises a test substrate 1103 and a plurality of integrated circuit chips 1104 coupled to the top surface of the test substrate. The bottom surface 1105 of the test substrate 1104 has a plurality of bonding pads 1106 connected to signal lines 1107 within the substrate. The chips 1104 also are connected to the signal lines 1107. The tester 1108 is coupled by a connector 1109 to the signal lines 1107. The tester 1108 has a memory 1130 for storing the test program, the expected test results, and the measured test results.

The module test card 1102 is temporarily bonded to the carrier under test 1101 by coupling the plurality of bonding pads 1106 on the module test card to corresponding bonding pads 1111 on the top surface of the carrier under test using a wire interconnection column 1112 on the bottom surface 1105 of the substrate 1103.

Referring now to FIG. 12, the interconnect column 1112 has an electrically conductive post 1114 for coupling the substrate 1103 to the carrier under test 1101. (Signal lines within the test substrate 1103 and the carrier under test 1101 are not shown for simplicity and clarity.) Furthermore, the electrically conductive post 1114 has an elongated body 1116, a top end 1117, and a bottom end 1118 on the opposite side of the body 1116 from the top end 1117. The top end 1117 is mounted on the bottom surface 1105 of the substrate 1103. The electrically conductive post 1114 preferably comprises a metallic material such as copper, nickel, cobalt, gold or palladium.

The electrically conductive post 1114 has an interior portion 1124 preferably made of copper. A coating layer 1125 preferably made of nickel surrounds the interior portion 1124 and a nickel oxide layer 1126 is disposed on the nickel layer 1125. The dimensions of the layers in the wire interconnect structure have been exaggerated so that these layers may be more clearly shown. The nickel oxide layer 1126 extends in the direction of elongation of the body 1116 from a point 1128 near the top end 1117 of the electrically conductive post 1114 to a point 1127 near the bottom end 1118 of the electrically conductive post. Each of the points 1127, 1128 are intermediate between the top end 1117 and the bottom end 1118 of the electrically conductive post 1114 with the point 1128 being intermediate between the point 1127 and the top end 1117.

In one embodiment, the bottom end 1118 has a substantially flat surface which is substantially coplanar with the bottom surface 1105. In addition, the body 1116 of each electrically conductive post 1114 of the column 1112 is substantially circular in a cross-sectional plane that is coplanar with the surface of the bottom end 1118. Additionally, each bottom end 1118 and top end 1117 is substantially circular and cross-sectional.

The interconnect column 1112 further comprises the pad 1106 disposed between the surface 1105 and the top end 1117 of the electrically conductive post 1114. The pad 1106 is mounted to the surface 1105 and the top end 1117 of the electrically conductive post 1114 is mounted to the pad 1106. Preferably the pad 1106 comprises a metallic material such as copper, nickel, cobalt, gold or palladium.

The circuit traces either on the surface or internal to the module test card are coupled to the wire interconnect column 1112.

A bump 1180 of reflowable and electrically conductive material such as solder is coupled to the top surface of the carrier under test. In one embodiment of the present invention in which the bump 1180 comprises a soldering material, the bump is initially approximately hemispherical in shape and disposed on a circular metallic pad 1111 on the top surface of the carrier under test. The electrically conductive post 1114 preferably comprises a material having a higher melting or reflow temperature point than the material of the bump 1180.

To couple the electrically conductive post 1114 to the bump, both the electrically conductive post 1114 and bump are heated to a temperature which causes the material of the bump 1180 to become reflowable in the case of a solder material, or pliable in the case of a polymer material. During this heating process, the carrier under test and a test substrate are brought in close proximity to each other so that bump makes contact with the bottom end 1118 of a corresponding electrically conductive post 1114. By bringing the electrically conductive post and the bump into pressure contact, once the melting temperature of the material of the bump is reached, the bump begins to reflow around the electrically conductive post near the bottom end 1118. Once reflowed, the temperature of the test substrate and the carrier under test are lowered to cause the bump to solidify around the electrically conductive post, thereby making electrical and mechanical coupling.

The electrically conductive post 1114 is disconnected from the bump 1180 by heating the bump to its melting temperature and moving the test substrate away from the carrier under test. The melting temperature of the bump 1180 is lower than the melting temperature of the post 1114.

The nickel layer 1125 acts as a barrier to any solder-copper chemical interactions which may occur between the bump 1180 and the electrically conductive post 1114. The oxide layer 1126 functions as a solder dam so that it limits the creep of solder from the bump in the direction from the bottom end 1118 to the top end 1117. This solder dam is at the point 1127 and prevents solder from the bump from coating the sides of the electrically conductive post. The solder increases the width of the electrically conductive post and reduces the aspect ratio (ratio of length to width) of the electrically conductive post, thereby deconcentrating the mechanical stress at the ends of the electrically conductive post.

The interconnect column has a peripheral edge 1119 formed around the top end 1117 next to the surface 1105 of the test module card substrate. In a preferred embodiment of the interconnect column, a fillet 1122 of rigid material is disposed along the peripheral edge 1119. The fillet preferably comprises a solder. The fillet 1122 contacts portions of the pad 1106 and the electrically conductive post 1114 near the top end 1117. The fillet 1122 extends up the electrically conductive post 1114 from the end 1117 to substantially point 1128. The fillet 1122 extends outward on the pad 1106 to a point 1129.

Alternatively, the interconnect column may be attached to the carrier under test and the bump may be on the test substrate.

By limiting the forces applied to the wire interconnect column, the module test card may be temporarily attached to and subsequently detached from the carrier under test 101, thereby allowing the module test card to be used for testing successive carriers under test.

Figure 4:
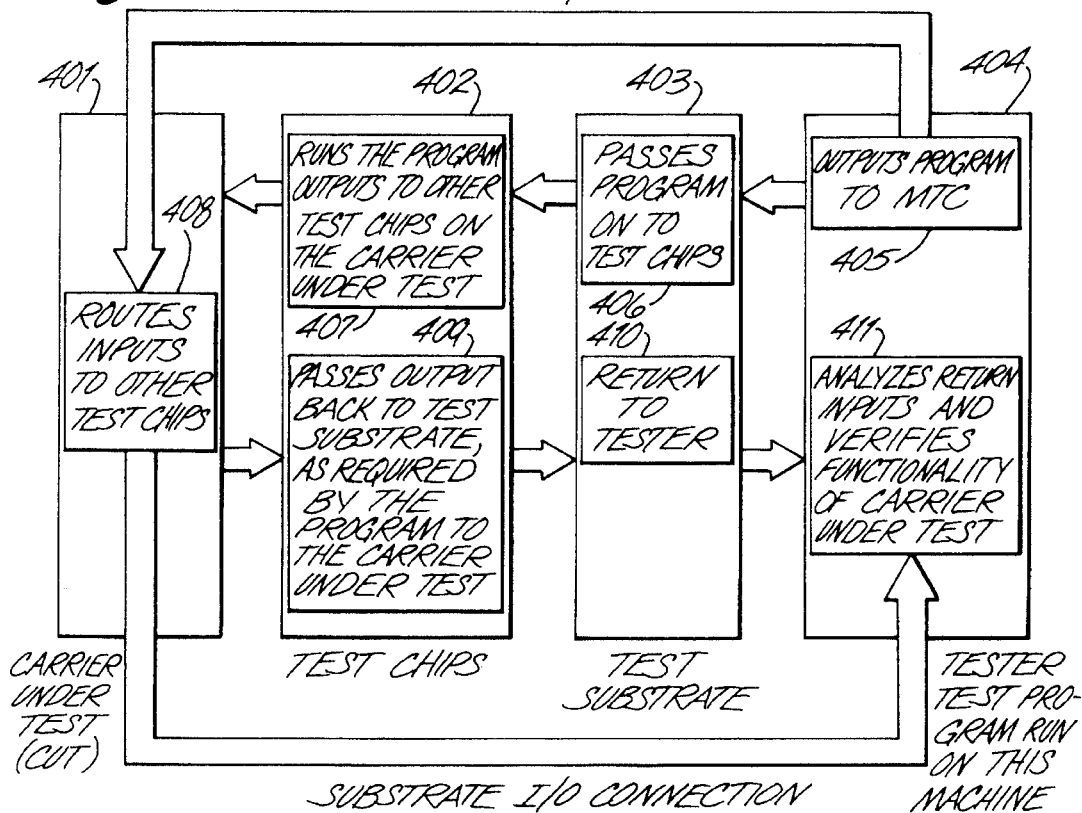
FIG. 4 illustrates how a test is performed on a carrier under test (CUT) in accordance to the present invention.

FIG. 4 illustrates how a test is performed on a carrier under test 101 under the present invention. The test is illustrated using the setup 200 of FIGS. 2a and 2b.

Referring to FIG. 4, the carrier under test 101 in FIGS. 2a and 2b is represented as block 401. The carrier under test 101 is connected to the test chips 104, which are represented in FIG. 4 as block 402. The test chips 402 are coupled to the test substrate 103 which is represented in FIG. 4 as block 403. The test substrate 403 is in turn coupled to a tester 105, which is represented in FIG. 4 as block 404.

To test the carrier under test 401, a test program is executed in the tester 404. This test program may actually be a utility/application program (e.g., a Lotus 1-2-3 program). In executing the test program, a plurality of signals are output from the tester 404 to the module test card (MTC) (block 405). Through interconnections in the test substrate 403, the signals are passed to the test chips 402 (block 407).

Within the test chips 402, the signals may either be changed into a new set of test signals or they may simply be output to the carrier under test 401. The signals travel through signal paths within the carrier under test 401 and return to the test chips (blocks 408 and 409). Depending upon the implementation, the test chips 402 may pass these resultant signals (or a subset thereof) back to the tester (block 410) or they may re-send the signals back to the carrier under test 401. Ultimately, the resultant signals are collected by the tester 404 and analyzed (block 411). Such analysis may simply check to see whether the application program is run properly by comparing the resultant test signals with expected test signals. The analysis may verify that the electrical capacitance, inductance, resistance, and impedance of the signal paths in the carrier are within a specified range, and that the data transmitted through the carrier is readable by the receiving chip in the module test card. Based on the verification, the carrier may be accepted as good or rejected as defective.

Figure 5:
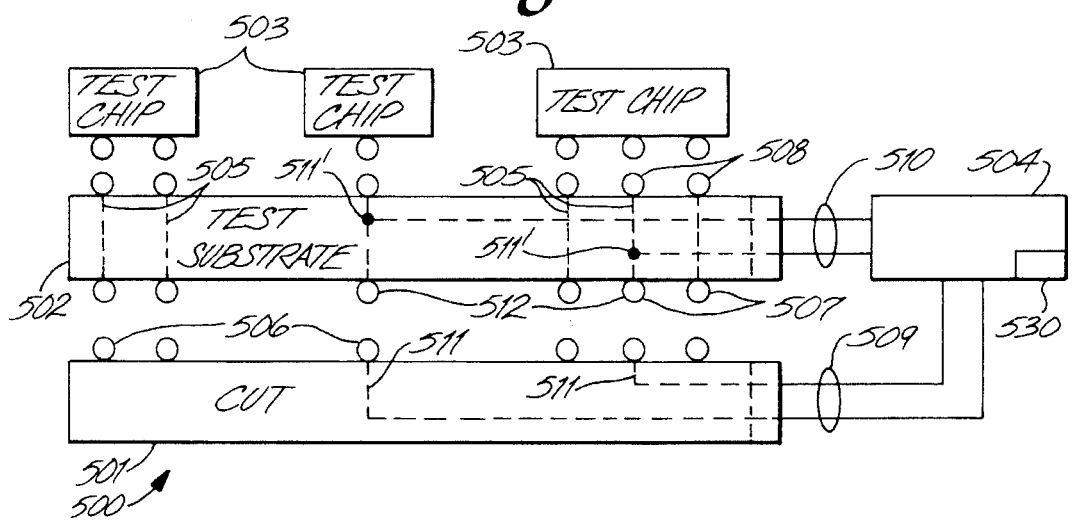
FIG. 5 illustrates an exemplary test setup which embodies the present invention.

FIG. 5 illustrates one implementation of the present invention. The setup 500 comprises a plurality of test chips 503, a test substrate 502, and a carrier under test 501.

It is assumed for this implementation that the carrier under test 501 is a motherboard to be populated with a set of semiconductor chips to form a computer. It is also assumed that, as in typical motherboards, that the carrier under test 501 has one or more input/output (I/O) connectors 509 for connecting to external devices such as disks, keyboards and/or monitors which are connected to tester 504 during the testing procedure. Since signals to the I/O connectors 509 would typically originate from or be received by a chip, the carrier under test 501 has a plurality of bond sites 511 that are connected to the I/O connector(s) 509. These bond sites are hereinafter referred to as the "I/O bond sites."

To test the carrier under test 501, a module test card according to the present invention is formed. The module test card comprises a test substrate 502 having top and bottom surfaces. Both surfaces have contacts that match the bonding sites 506 on the surface of the carrier under test 501. In other words, each bonding site on the carrier under test 501 has a corresponding contact 508 on the top surface and a corresponding contact 507 on the bottom surface of the test substrate 502. Each pair of corresponding contacts 507, 508 are connected by through-hole connections 505.

On the side of the test substrate 502, one or more I/O connector(s) 510, corresponding to the connector(s) 509 on the carrier under test 501, are provided. Interconnections 511' are formed between the connector(s) and contact points 512 that correspond to the I/O bond sites 506.

A set of test chips 503 is mounted on the top surface of the test substrate 502. In this exemplary test setup 500, the test chips 503 may be identical to the chips that will finally be mounted onto the carrier under test 501 to form the computer.

The carrier under test 501 is coupled to the bottom surface of the test substrate 502 by means of a z-axis elastomer. A z-axis elastomer comprises an elastomeric sheet or film which is essentially non-conductive in the x and y directions, that is, within the plane of the sheet. It is, however, electrically conductive in the z direction, namely through the sheet, when pressure is applied. It is a property of the material that electrical conductivity increases as pressure is applied. The elastomeric material deflects under pressure to assure good contact with pins or pads pressed against opposite faces of the sheet. Thus, when the sheet is interposed between conductive pads or pins on adjacent carriers or the like, electrical contact can be made between pins or pads that are opposite each other without shorting between adjacent pins. A set of test chips 503 is connected to the test substrate 502 through connectors 508. A tester 504 has a memory 530 for storing the test program, the expected test results, and the measured test results. The tester is connected to test setup 500 through I/O connector(s) 510 and 509.

The carrier under test 501, test substrate 502 and test chips 503, when coupled together as described hereinabove, basically form the computer.

After the computer is formed as described above, a benchmark program is run. This benchmark program may comprise one or more application software programs. If the benchmark program runs successfully, the carrier under test 501 is considered to be free of defects. It is then decoupled from the test substrate 502 and passes to final assembly.

Figure 6:
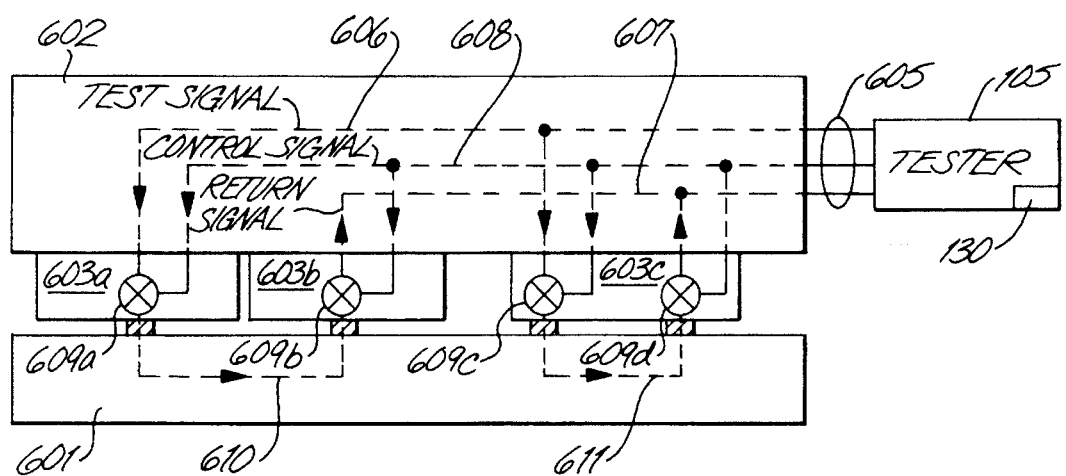
FIG. 6 illustrates another exemplary test setup which embodies the present invention.

FIG. 6 illustrates how the electrical length of critical paths 610 and 611 in a carrier under test 601 can be tested.

The carrier under test 601 can be tested by an module test card which comprises a test substrate 602 and a plurality of test chips 603. The test substrate 602 has a plurality of signal paths, including a signal path 606 which carries a test signal from the tester 105 to the carrier under test 601 via the test chips 603. This test signal can travel through the carrier under test 601 in either path 610 or 611. The selection of paths 610 and 611 to be travelled by the test signal is controlled by switches 609 which, in turn, are controlled by a control signal 608 from the tester 105. When a path is selected, the corresponding return path is also selected by controlling switches 609b so that the test signal can return to the tester 105 via path 607.

To illustrate, the tester 105 first tests path 610 by setting switches 609a and 609b with control signal 608. The tester 105 then sends a test signal to path 606. The test signal travels from the tester 105 through path 606 to 603a and to path 610. It returns to the test substrate 602 through 603b and finally to the tester 105 through path 607. The tester 105 measures the difference between time the test signal is sent and the time the return signal is received. From the difference, the electrical length of the path 610 can be determined.

The tester 105 can similarly test path 611 by setting switches 609a and 609b so that the test signal travels through path 610 to 611 through test chip 603c and returns to the tester 105 through test chip 603c and path 607.

Figure 13:
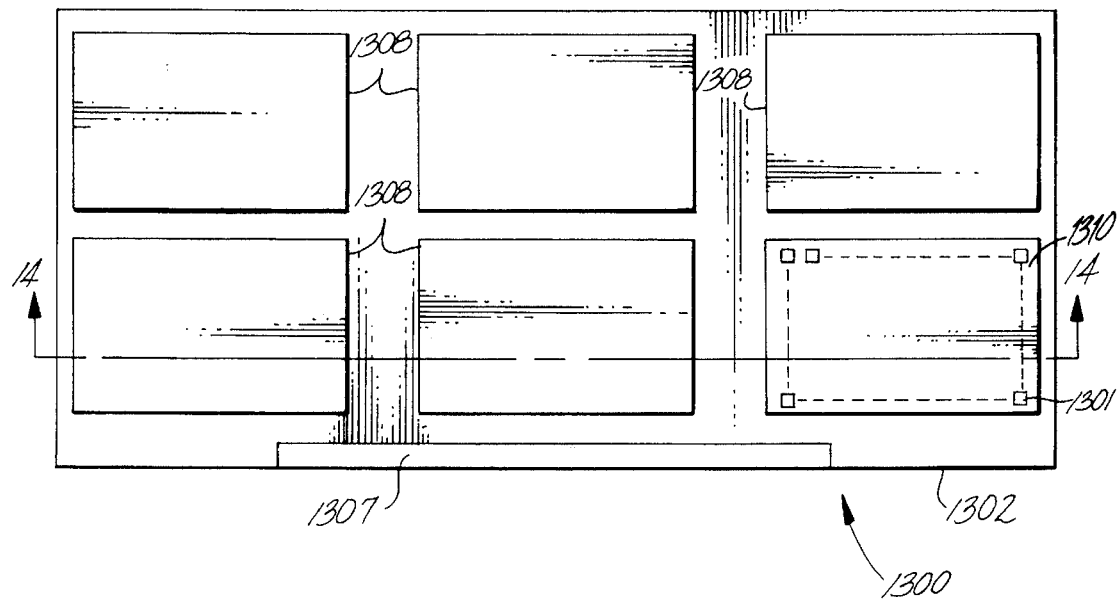
FIG. 13 is a top plan view showing a partially populated multi-chip module (MCM) according to principles of the invention.
Figure 14:
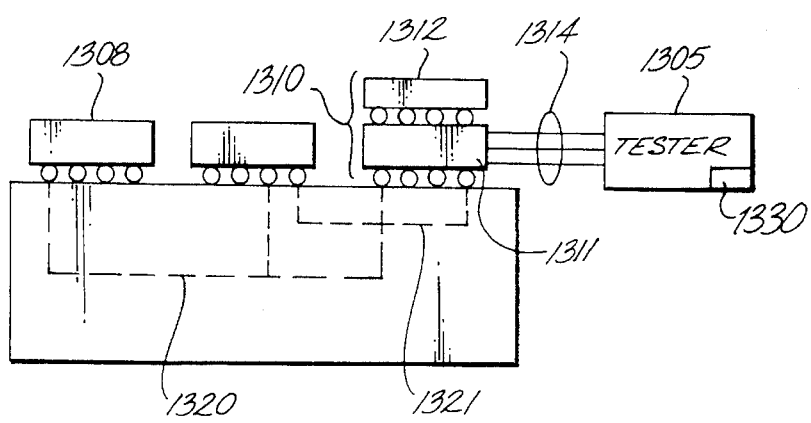
FIG. 14 is a cross-sectional view of the MCM taken along line 14–14 of FIG. 13 with a module test card connected to the multi-chip module constructed according to principles of the invention.

FIG. 13 is a top plan view showing a partially populated multi-chip module (MCM) according to principles of the invention. FIG. 14 is a cross-sectional view of the MCM taken along line 14—14 of FIG. 13 with a module test card connected to the multi-chip module constructed according to principles of the invention.

A multi-chip module 1300 comprises a multi-layer interconnection substrate 1302 having a plurality of signal traces 1320, 1321 (shown in FIG. 14) for communicating electrical signals between integrated circuit chips 1308. The integrated circuit chips 1308 are preferably processor chips to thereby form a multiple processor module. Only two signal traces 1320, 1321 are shown for illustrative purposes. The number of signal traces varies with the type and design of the circuit. The interconnection substrate 1302 preferably comprises a multi-layer ceramic dielectric body portion having electrical interconnects for translating electric signals. Alternatively, the interconnection substrate comprises a printed wiring board. A connector interface 1307 is on the top surface of the interconnection substrate 1302. The connector interface 1307 has a plurality of bond pads (not shown) for electrically interfacing with an external connector (not shown) to thereby communicate electrical signals between the multi-chip module and an external electronic device such as other multi-chip modules, computer keyboards, terminals, printers, disks and other input/output devices or interfaces. Although six processors 1308 are shown in FIG. 13, the invention is not so limited.

Similar to the module test cards described above, a module test card 1310 comprises a test substrate 1311 and a processor chip 1312 coupled to the top surface of the test substrate. The bottom surface of the test substrate 1311 has a plurality of bond pads connected to signal lines within the substrate. The tester 1305 and the processor chip 1312 also are connected to the signal lines. The tester 1305 is coupled by a connector 1314 to the module test card 1310. The tester 1305 has a memory 1330 for storing the test program, the expected test results, and the measured test results. Alternatively, the test substrate 1311 may have a plurality of processor chips 1312 on the top surface. In addition, the test substrate 1311 may be coupled to a plurality of bond pads for a plurality of processor chips that will be coupled to the multi-chip module 1300.

In a preferred embodiment, the processor chips 1312 is identical to the processor chips 1308 that are coupled to the multi-chip module 1300 during operational conditions. Thus, by using a known good module test card 1310, an unknown multi-chip module may be tested.

The module test card 1310 is temporarily bonded to the processor module under test 1300 by coupling the plurality of bond pads on the module test card to corresponding bond pads on the processor module under test 1300 in the manner described above. The multi-chip module is then tested as described above.

The module test card of any of the described embodiments and implementations may be used for testing the operation of the carrier under test over a temperature range. For example, the carrier may experience operational temperatures ranging from a cold temperature of 0° C. to a hot temperature of 65° C. By subjecting the carrier under test to these temperature extremes, the carrier under test is susceptible to reliability problems. Moreover, the performance of the functional circuits may vary over temperature in addition to variations within the carrier under test. By designing the test chips to reflect the temperature characteristics of the functional circuits, the environmental testing of the carrier under test exposes these problems. For example, the effect of simultaneous switching on ground bounce may be exacerbated by the temperature extremes. Thus, by performing the tests on the carrier under test over a range of temperature, a margin of safety in the performance of the carrier under test is obtained.

The above description discloses a technique and apparatus for testing a chip carrier prior to population of chips thereon. The testing is performed through a module test card which provides means for converting signals from the tester into signals that simulate operating environment of the semiconductor device. Through such conversion, more accurate functional testing can be performed on the carrier.

A description of the particular embodiment is given above for the understanding of the present invention. It will be understood by those skilled in the art that various modifications and additions can be made without substantially departing from the scope of this invention which is defined by the following claims.

What is claimed is:

1. In manufacturing semiconductor devices formed respectively by a plurality of chips and a carrier of the chips, a method for increasing production yield through refined testing methods, comprising the steps of:

electrically coupling, prior to population of the chips thereon, the carrier to a module test card, said module test card having a test substrate and a plurality of test chips on the test substrate, electrically coupling said module test card to a tester, testing said carrier utilizing said module test card to generate test results, and comparing the test results with expected results to accept or reject the carrier.

2. A method as claimed in claim 1, wherein said testing step comprises a step of simulating one or more operations of the semiconductor devices.

3. A method as in claim 1, wherein said electrically coupling step comprises a step of electrically connecting said carrier to said module test card using reusable electrically conductive material.

4. A method as in claim 3, wherein said electrically coupling step comprises a step of electrically connecting said carrier to said module test card using a layer of z-axis elastomer.

5. A method as in claim 3, wherein said electrically coupling step comprises a step of electrically connecting said carrier to said module test card using a set of contact bumps.

6. A method as in claim 5, wherein said contact bumps are formed with gold.

7. A method as in claim 5, wherein said contact bumps are solder.

8. A method as in claim 3, wherein said electrically coupling step comprises a step of electrically connecting said carrier to said module test card using a tape automated bonding process.

9. A method as in claim 1, wherein the test chips have a memory, the step of testing said carrier further comprising the steps of:

storing test results in the memory, electrically decoupling the carrier from the module test card, electrically coupling a memory read-back probe to the module test card, and reading the test results from the memory.

10. An apparatus for testing a carrier of semiconductor chips prior to population of chips thereon to form a semiconductor device, comprising:

a test substrate, a plurality of test chips coupled to the test substrate, means for temporarily electrically connecting a test substrate to said carrier, and means for electrically coupling the test substrate to a tester.

11. An apparatus as in claim 10, wherein said test chips comprise at least one chip having a gate array.

12. An apparatus as in claim 10, wherein said test chips comprise at least one chip forming a memory.

13. An apparatus as in claim 10, wherein said test chips comprise at least one chip forming logic circuits for performing functions of a data processing unit.

14. An apparatus as in claim 13, wherein said test chips further comprise at least one chip forming a memory.

15. An apparatus as in claim 10, wherein said means for electrically connecting said test substrate to said carrier comprises a layer of electrically conductive material.

16. An apparatus as in claim 15, wherein said layer of electrically conductive material is reusable.

17. An apparatus as in claim 15, wherein means for electrically connecting said test substrate to said carrier comprises a layer of z-axis elastomer.

18. An apparatus as in claim 10, wherein said means for electrically connecting said test substrate to said carrier comprises at least one contact bump.

19. An apparatus as in claim 18, wherein said contact bumps are formed with gold.

20. An apparatus as in claim 18, wherein said contact bumps are formed with solder.

21. An apparatus as in claim 10, wherein said means for electrically connecting said test substrate to said carrier comprises means for electrically connecting said test substrate and said carrier by a tape automated bonding process.

22. A method for testing a multi-chip module carrier on which a plurality integrated circuit chips are to be mounted, comprising the steps of:

mounting a plurality of integrated circuit chips on a substrate, the integrated circuit chips on the substrate emulating the chips or a subset of the chips to be mounted on a carrier;

establishing temporary electrical contact between the integrated circuit chips on the substrate and a carrier under test;

establishing electrical contact between the integrated circuit chips on the substrate and a testing apparatus;

applying input signals to the chips on the substrate from the testing apparatus;

analyzing output signals from the chips on the substrate with the testing apparatus; and disconnecting the electrical contact between the integrated circuit chips on the substrate and the carrier.

23. A method as recited in claim 22 comprising the steps of:

mounting the integrated circuit chips on one face of the substrate;

establishing electrical contact between signal leads on the chips and electrical leads on the substrate;

establishing electrical contacts between signal leads on the substrate and the testing apparatus; and bringing bond pads on the chips into direct electrical connection with bond pads on a carrier under test.

* * * * *